United States Patent
Goh

(10) Patent No.: US 8,436,255 B2
(45) Date of Patent: May 7, 2013

(54) FAN-OUT WAFER LEVEL PACKAGE WITH POLYMERIC LAYER FOR HIGH RELIABILITY

(75) Inventor: Kim-Yong Goh, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 346 days.

(21) Appl. No.: 12/651,295

(22) Filed: Dec. 31, 2009

(65) Prior Publication Data

US 2011/0157853 A1     Jun. 30, 2011

(51) Int. Cl.
*H05K 1/11*     (2006.01)

(52) U.S. Cl.
USPC ........... 174/263; 174/256; 174/260; 361/767; 361/783; 29/825

(58) Field of Classification Search ................... 361/760, 361/767, 783; 174/260–265; 29/825, 829–831
See application file for complete search history.

(56) References Cited

U.S. PATENT DOCUMENTS

| | | | |
|---|---|---|---|
| 4,603,374 A | | 7/1986 | Wasielewski |
| 4,715,115 A | | 12/1987 | King et al. |
| 5,222,014 A | | 6/1993 | Lin |
| 5,309,011 A | | 5/1994 | Tazunoki et al. |
| 5,355,580 A | * | 10/1994 | Tsukada .................. 29/840 |
| 5,488,200 A | * | 1/1996 | Tsukada .................. 174/261 |
| 5,936,843 A | | 8/1999 | Ohshima et al. |
| 6,253,992 B1 | | 7/2001 | Fjelstad |
| 6,271,469 B1 | * | 8/2001 | Ma et al. ................. 174/521 |
| 6,344,682 B1 | | 2/2002 | Tomita |
| 6,350,668 B1 | * | 2/2002 | Chakravorty ............... 438/612 |
| 6,717,245 B1 | * | 4/2004 | Kinsman et al. ............ 257/678 |
| 6,828,665 B2 | | 12/2004 | Pu et al. |
| 6,882,054 B2 | | 4/2005 | Jobetto |
| 6,940,169 B2 | | 9/2005 | Jin et al. |
| 7,067,911 B1 | | 6/2006 | Lin et al. |
| 7,141,873 B2 | | 11/2006 | Aoyagi |
| 7,193,301 B2 | | 3/2007 | Yamaguchi |
| 7,489,032 B2 | | 2/2009 | Jobetto |
| 7,714,453 B2 | | 5/2010 | Khan et al. |
| 7,772,687 B2 | | 8/2010 | Inoue |

(Continued)

OTHER PUBLICATIONS

Kim-Yong Goh, "Multi-Stacked Semiconductor Dice Scale Package Structure and Method of Manufacturing Same," U.S. Appl. No. 12/651,080, filed Dec. 31, 2009, 38 pages.

(Continued)

*Primary Examiner* — Hoa C Nguyen
(74) *Attorney, Agent, or Firm* — Seed IP Law Group PLLC

(57) ABSTRACT

A polymeric layer encompassing the solder elements of a ball grid array in an electronics package. The polymeric layer reinforces the solder bond at the solder ball-component interface by encasing the elements of the ball grid array in a rigid polymer layer that is adhered to the package structure. Stress applied to the package through the ball grid array is transmitted to the package structure through the polymeric layer, bypassing the solder joint and improving mechanical and electrical circuit reliability. In one embodiment of a method for making the polymeric layer, solder elements bonded to external pads on a structure of the package are submerged in a fluidic form of the polymeric layer. The fluidic form is solidified and then a portion of the resulting polymeric layer is removed to make the solder elements accessible for mounting the package to a printed circuit board or other external circuit.

12 Claims, 13 Drawing Sheets

U.S. PATENT DOCUMENTS

| | | | |
|---|---|---|---|
| 7,871,861 B2 | 1/2011 | Song et al. |
| 7,989,707 B2 | 8/2011 | Yamano et al. |
| 8,003,496 B2 | 8/2011 | Oh et al. |
| 8,004,092 B2 | 8/2011 | Lin et al. |
| 8,106,495 B2 | 1/2012 | Kajiki |
| 8,125,066 B1 | 2/2012 | Kang |
| 8,158,888 B2 | 4/2012 | Shen et al. |
| 2002/0070443 A1 | 6/2002 | Mu et al. |
| 2004/0075164 A1 | 4/2004 | Pu et al. |
| 2005/0041134 A1 | 2/2005 | Takayama |
| 2005/0121764 A1 | 6/2005 | Mallik et al. |
| 2005/0146051 A1 | 7/2005 | Jobetto |
| 2005/0161823 A1 | 7/2005 | Jobetto et al. |
| 2006/0091521 A1 | 5/2006 | Cady et al. |
| 2006/0256222 A1 | 11/2006 | Tsai |
| 2007/0090508 A1 | 4/2007 | Lin et al. |
| 2007/0181989 A1 | 8/2007 | Corisis et al. |
| 2008/0017968 A1 | 1/2008 | Choi et al. |
| 2008/0083988 A1 | 4/2008 | Lin |
| 2008/0157329 A1 | 7/2008 | Inoue |
| 2009/0127688 A1 | 5/2009 | Lee et al. |
| 2009/0212412 A1 | 8/2009 | Yoon |
| 2009/0322437 A1 | 12/2009 | Avni et al. |
| 2010/0072600 A1 | 3/2010 | Gerber |
| 2010/0090323 A1 | 4/2010 | Shinoda et al. |
| 2010/0117212 A1 | 5/2010 | Corisis et al. |
| 2010/0148316 A1 | 6/2010 | Kim et al. |
| 2011/0032400 A1 | 2/2011 | Yang |
| 2011/0156230 A1 | 6/2011 | Goh |
| 2011/0156240 A1 | 6/2011 | Luan et al. |
| 2011/0156250 A1 | 6/2011 | Goh et al. |
| 2011/0157452 A1 | 6/2011 | Goh et al. |
| 2011/0260303 A1 | 10/2011 | Pagaila et al. |
| 2011/0278717 A1 | 11/2011 | Pagaila et al. |
| 2011/0291274 A1 | 12/2011 | Meyer et al. |
| 2011/0316146 A1 | 12/2011 | Pagaila et al. |
| 2011/0316156 A1 | 12/2011 | Pagaila et al. |
| 2012/0049364 A1 | 3/2012 | Sutardja et al. |

OTHER PUBLICATIONS

Kim-Yong Goh et al., "Fan-Out Wafer Level Package for an Optical Sensor and Method of Manufacture Thereof," U.S. Appl. No. 12/651,304, filed Dec. 31, 2009, 27 pages.

Kim-Yong Goh et al., "Flip-Chip Fan-Out Wafer Level Package for Package-on-Package Applications, and Method of Manufacture," U.S. Appl. No. 12/651,365, filed Dec. 31, 2009, 20 pages.

Jing-En Luan et al., "Reliable Large Die Fan-Out Wafer Level Package and Method of Manufacture," U.S. Appl. No. 12/651,362, filed Dec. 31, 2009, 27 pages.

ASE Tech Forum, "ASE PoP (TRD PoP & MAP PoP)," The Advanced Semiconductor Engineering Group, Sep. 2007, 37 pages.

Chua et al., "Method for Producing Vias in Fan-Out Wafers Using Dry Film and Conductive Paste, and a Corresponding Semiconductor Package," U.S. Appl. No. 12/977,697, filed Dec. 23, 2010, 34 pages.

Goh, "Fan-Out Wafer Level Package with Polymeric Layer for High Reliability," U.S. Appl. No. 12/649,130, filed Dec. 29, 2009, 30 pages.

Jin, "Apparatus and Method for Placing Solder Balls," U.S. Appl. No. 13/340,275, filed Dec. 29, 2011, 31 pages.

Johnson, "STATS ChipPAC Expands eWLB to Reconstituted 300 mm Wafers," Semiconductor International, published Apr. 15, 2010, downloaded from http://english.ime.cas.cn/ns/es/201004420100429_53569.html, published by Microelectronice of Chinese Academy of Science, 2007, 2 pages.

\* cited by examiner

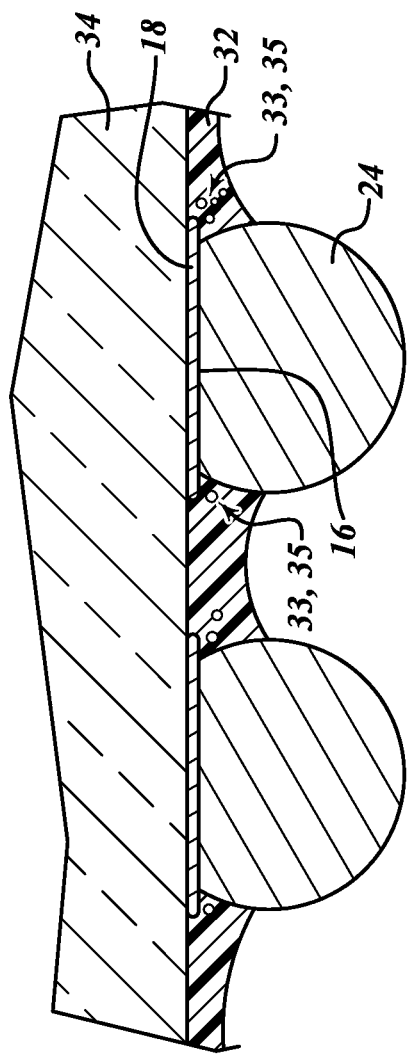
FIG. 5 *(Prior Art)*

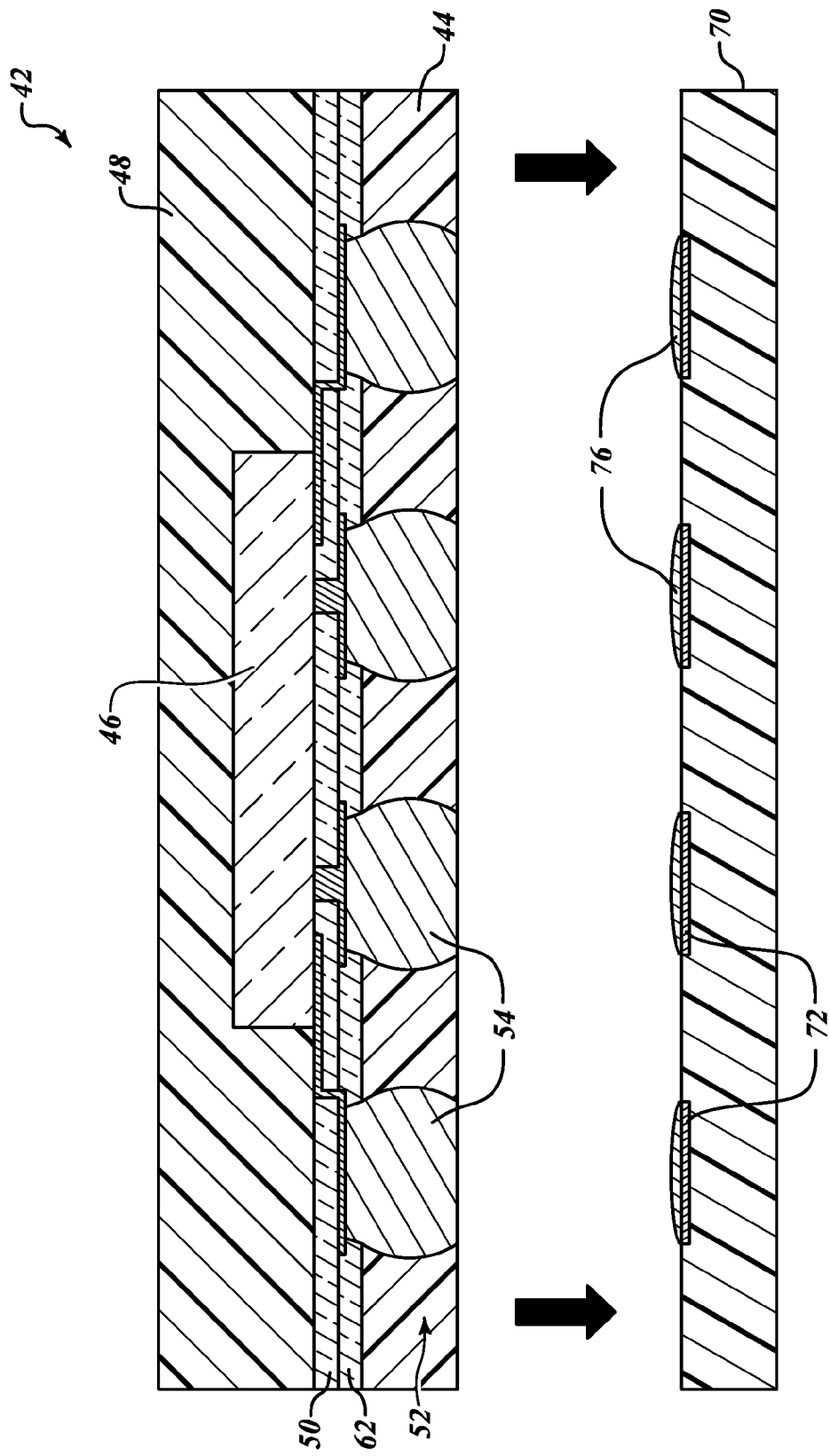

FAN-OUT WAFER LEVEL PACKAGE WITH POLYMERIC LAYER FOR HIGH RELIABILITY

BACKGROUND

1. Technical Field

This description generally relates to the field of electronic packaging, and, in particular, to mechanical components of electronic packages.

2. Description of the Related Art

Issues of mechanical and electrical reliability are of growing interest in ball bonded wafer-level packages, especially as the size of wafer-level packages increases. Larger package sizes increase the likelihood of mechanical failures, particularly at or near solder joints, from either externally applied mechanical stress or developed stress due to thermal expansion. Mechanical failures often lead to electrical failures.

One common mechanical failure mode in wafer-level packages is passivation or redistribution layer delamination. FIG. 1 shows an example of a delamination failure, exhibited by a delamination crack 10 in a passivation layer 12. The delamination crack 10 in FIG. 1 developed as a result of a series of controlled drops conducted as part of a drop test failure analysis. The test was performed according to a mechanical strength testing protocol prescribed for packages used in portable communication devices. The test included a series of drops by a sufficient number of samples to determine a failure rate. FIG. 1 shows that the delamination crack 10 enters the passivation layer 12 at a point 14 next to a solder joint 16 and then passes through the passivation layer 12 above a solder bond pad 18.

Another common failure mode in wafer-level packages is a crack in a silicon die 20 of the package. FIG. 2 shows a silicon die crack 22 that passes around the solder joint 16 by propagating through the silicon die 20. The silicon die crack 22 appears as a horizontal line passing through the silicon die 20 above the solder bond pad 18. In this failure, the bond pad 18 detaches from the silicon die 20 and remains bonded to an attached solder ball 24.

Yet another common failure mode in wafer-level packages is a crack in the solder ball 24. FIG. 3 shows a solder bond crack 26 that passes around the solder joint 16 by propagating through the solder ball 24 parallel with the solder joint 16. This failure typically occurs at a point 28 where the solder ball 24 meets the solder bond pad 18, because this is the narrowest point of the solder ball 24.

Techniques have been developed in the packaging field to attempt to reduce these failures by relieving the stress that must be carried by the bond between the solder ball 24 and its bond pad 18. One technique is the application of a polymer flux 30 to the solder ball 24 at the point where the solder ball meets the silicon die 20 or a redistribution layer if one is used. As shown in FIG. 4, the polymer flux 30 supports the solder ball 24 close to the bond pad 18 at the solder joint 16. The flux 30 carries a portion of the stress that would formerly have been carried entirely by the solder joint 16. The polymer flux 30 is applied at the same time that the solder ball 24 is applied to the bond pad 18, and therefore there involves no extra process step. A disadvantage of this technique is the difficulty in maintaining consistent thickness of the polymer flux 30. Since package reliability is subject to the polymer flux thickness, inconsistent thickness control gives rise to undesirable variations in reliability.

Another technique in the prior art that attempts to improve mechanical and electrical reliability is the front side protect technique. With the front side protect technique, a polymer material 32 is applied to a face of an electronic package 34 after the solder balls 24 have been placed on the bond pads 18. As shown in FIG. 5, the polymer material 32 couples the solder balls 24 and the package 34 in the same way as the polymer flux technique in FIG. 4. One problem with the front side protect technique is that because the polymer material 32 is applied after the solder balls 24 are placed, voids 33, 35 can form in the polymer material at the point where the solder ball 24 and the bond pad 18 meet. The size and location of these voids 33, 35 cannot be easily controlled or predicted. A void 33, 35 at this point severely diminishes the strengthening effect of the front side protect technique. The front side protect technique was used in the example of FIG. 3, yet a solder bond failure occurred anyway.

A third technique in the art is underfill, shown in FIGS. 6A and 6B. As shown in FIG. 6A, with the underfill technique a fluid polymer underfill 36 is dispensed into a space between an electronic package 34 and a printed circuit (PC) board 40, in and around the solder balls 24 that mount the electronic package 34 to the PC board 40, and then cured. As shown in FIG. 6B, once cured the underfill 36 mechanically couples the electronic package 34 to the PC board 40. One disadvantage of this technique is that it requires careful matching of the coefficients of thermal expansion of the electronic package 34 and the PC board 40. A second disadvantage is that component rework is made more difficult. If the electronic package 34 needs to be removed from the board for any reason, this is made more difficult by the underfill 36, which can lead to destruction of the package 34 during removal. Even if successful, the underfill 36 left behind on the PC board 40 must still be removed before a new electronic package 34 can be reconnected to the PC board 40.

BRIEF SUMMARY

According to one embodiment of the invention, an apparatus includes an electrical circuit such as a silicon die, a support structure, connection pads, solder elements and a polymeric layer. The structure supports the silicon die or other electrical circuit. The connection pads are positioned on a face of the structure and are electrically coupled to the supported electrical circuit or silicon die. The solder elements are aligned with, and bonded to, the connection pads. A fluidic polymer material is molded around the solder elements to form a rigid polymeric layer. The polymeric layer at least partially encompasses the solder elements bonded to the connection pads. The polymeric layer is parallel to and bound with the face of the structure. By encompassing the solder elements and binding with face of the structure, the polymeric relieves stress applied to the apparatus that otherwise would be transmitted through a bond between the solder elements and the connection pads. In a further embodiment of the invention, the structure the silicon die or other electrical circuit is connected to a PC board by bonding the solder elements to additional connection pads on the PC board.

In one embodiment the polymeric layer encompasses at least a majority surface area of the approximately ball-shaped solder elements. In another embodiment, the approximately ball-shaped solder elements include a flat surface on a side of the solder elements furthest from the structure. In a further embodiment, the polymeric collar encompasses the approximately ball-shaped bonded solder elements from where the solder elements bond to the connection pads on the structure continuously up to edges of the flat surfaces on the solder elements furthest from the structure. In yet a further embodiment, the polymeric layer occupies a space surrounding the solder elements and bounded by a plane coincident with the face of the structure, another plane coincident with the flat surfaces of the solder elements, and a perimeter circumscribing the solder elements bonded to the connection pads.

In one embodiment of a method of making the polymeric layer, solder elements are placed on, and bonded to, the electrical connection pads positioned on the exterior face of the housing. Next, encapsulation material is dispensed in fluid form onto the face of the housing until the placed solder elements are submerged. Next, the fluid form encapsulation material is solidified, which, depending on the encapsulation material selected, could be accomplished by curing, drying, aging, exposure to electromagnetic radiation, or other means. Next, a selected portion of the solidified encapsulation material is removed until the previously submerged solder elements are exposed. In a further embodiment of the method, the housing to which the solder elements are bonded can itself be bonded to a printed circuit board by bonding the solder elements exposed from the encapsulation material to pads on the printed circuit board.

The polymeric layer provides structural support to electrical circuits, for example silicon die circuits supported on a support structure. The polymeric layer reduces the stress that must be carried through a joint between a solder element and a connection pad in an electrical circuit supported on a structure. One advantage of the polymeric layer over prior art techniques is that the polymeric layer more completely encompasses the solder elements, providing greater reinforcement. Another advantage is that the thickness of the layer is more precisely controlled, providing a more repeatable level of reinforcement. Yet another advantage is that voids in the polymeric layer are much less likely to occur than in other techniques. Yet another advantage over other techniques is that the technique permits the electrical circuit to be removed from a mounting position on a PC board without difficulty.

BRIEF DESCRIPTION OF THE SEVERAL VIEWS OF THE DRAWINGS

FIG. 5 illustrates a cross-sectional view of a wafer-level package using another reinforcement technique found in the prior art.

FIGS. 8A-8E illustrate cross-sectional views of steps in a method for making an electrical circuit having a polymeric layer in accordance with one embodiment of the present invention.

DETAILED DESCRIPTION

Figure 1:
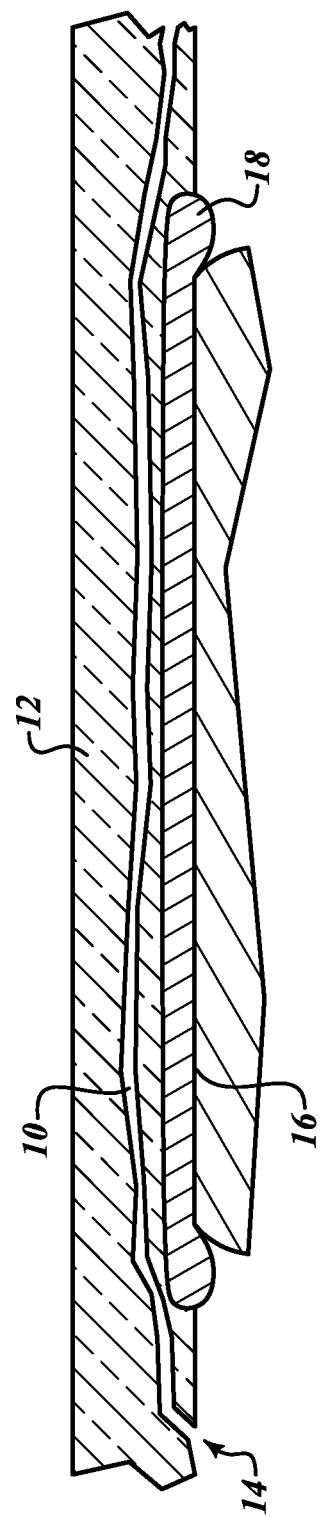
FIG. 1 illustrates a cross-sectional view of a wafer-level package exhibiting a failure mode of the prior art.
Figure 2:
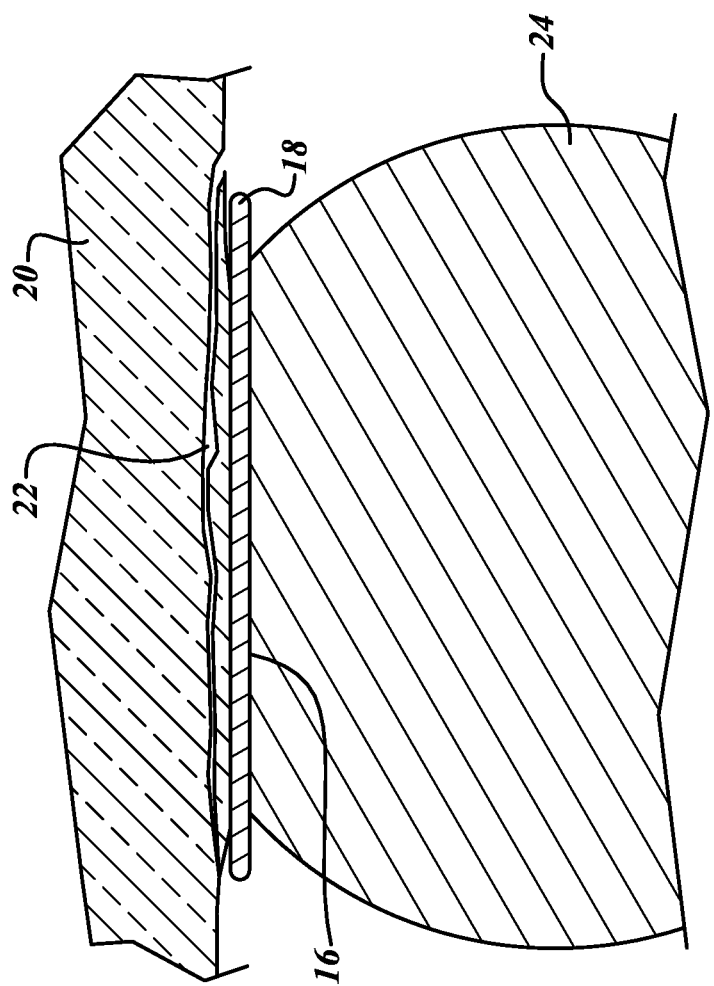
FIG. 2 illustrates a cross-sectional view of a wafer-level package exhibiting a second failure mode of the prior art.
Figure 3:
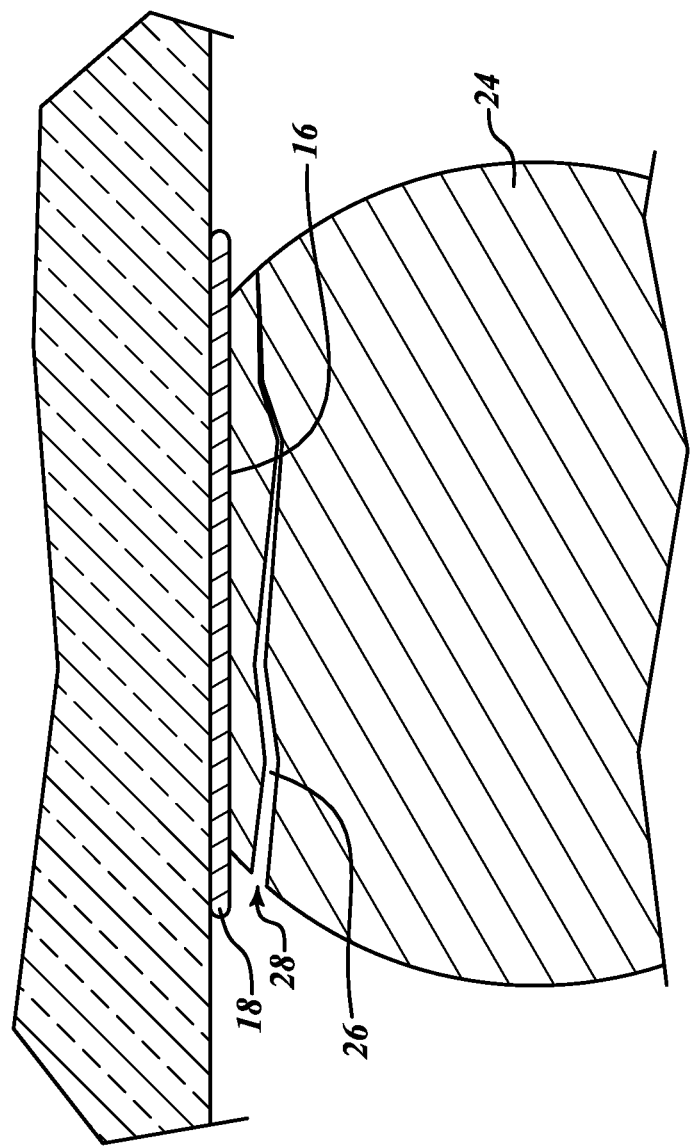
FIG. 3 illustrates a cross-sectional view of a wafer-level package exhibiting a third failure mode of the prior art.
Figure 4:
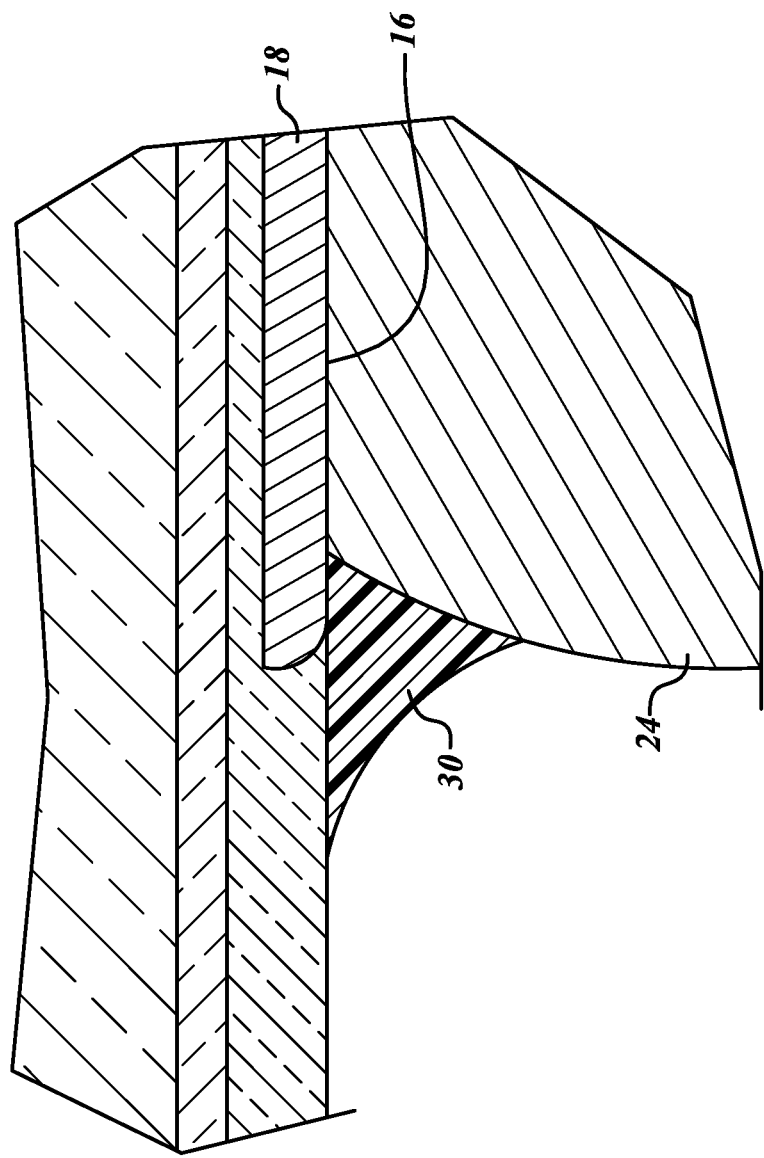
FIG. 4 illustrates a cross-sectional view of a wafer-level package using one reinforcement technique found in the prior art.
Figure 6A:
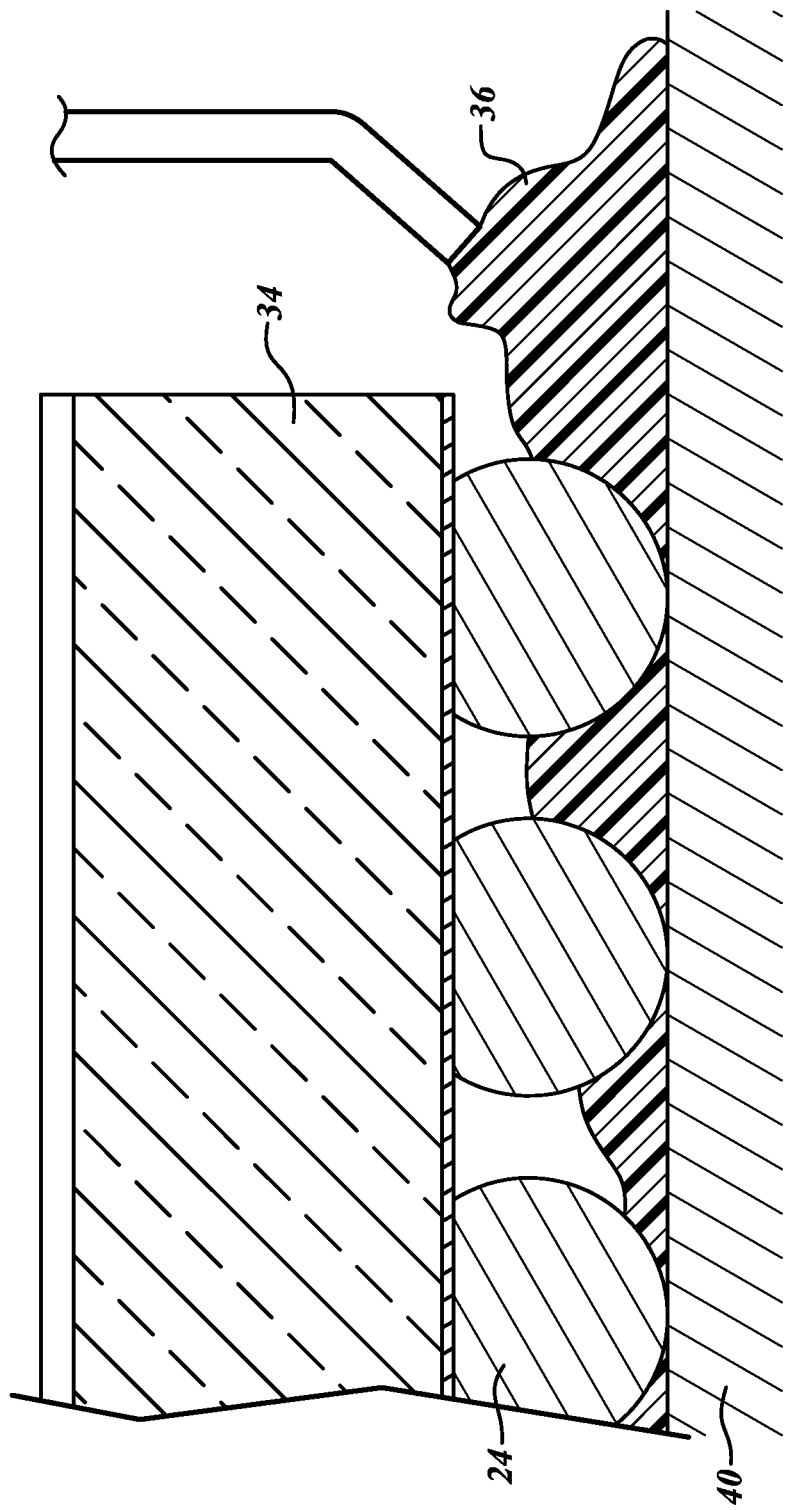
FIGS. 6A and 6B illustrate cross-sectional views of a wafer-level package using yet another reinforcement technique found in the prior art.
Figure 6B:
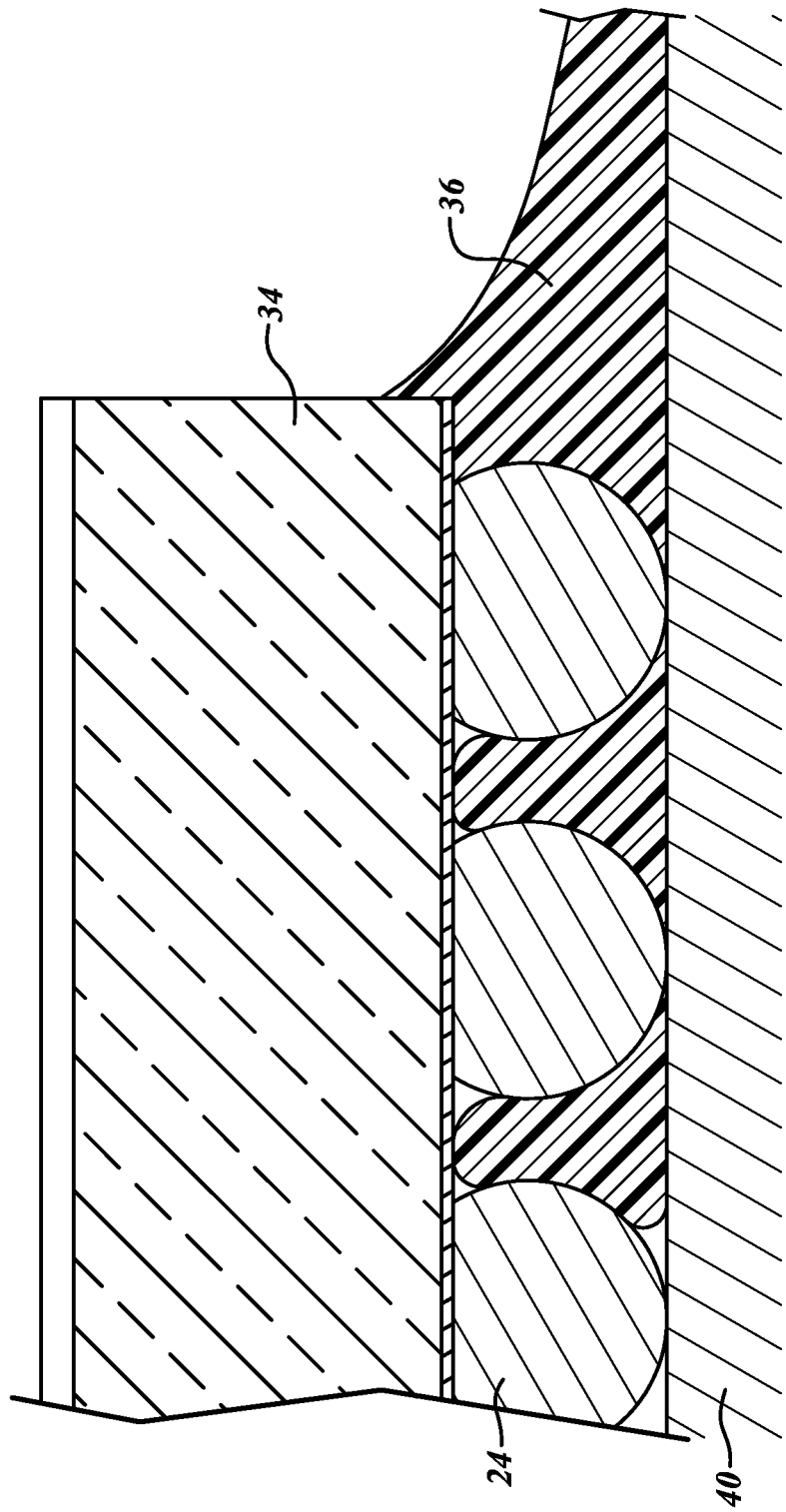
Figure 7:
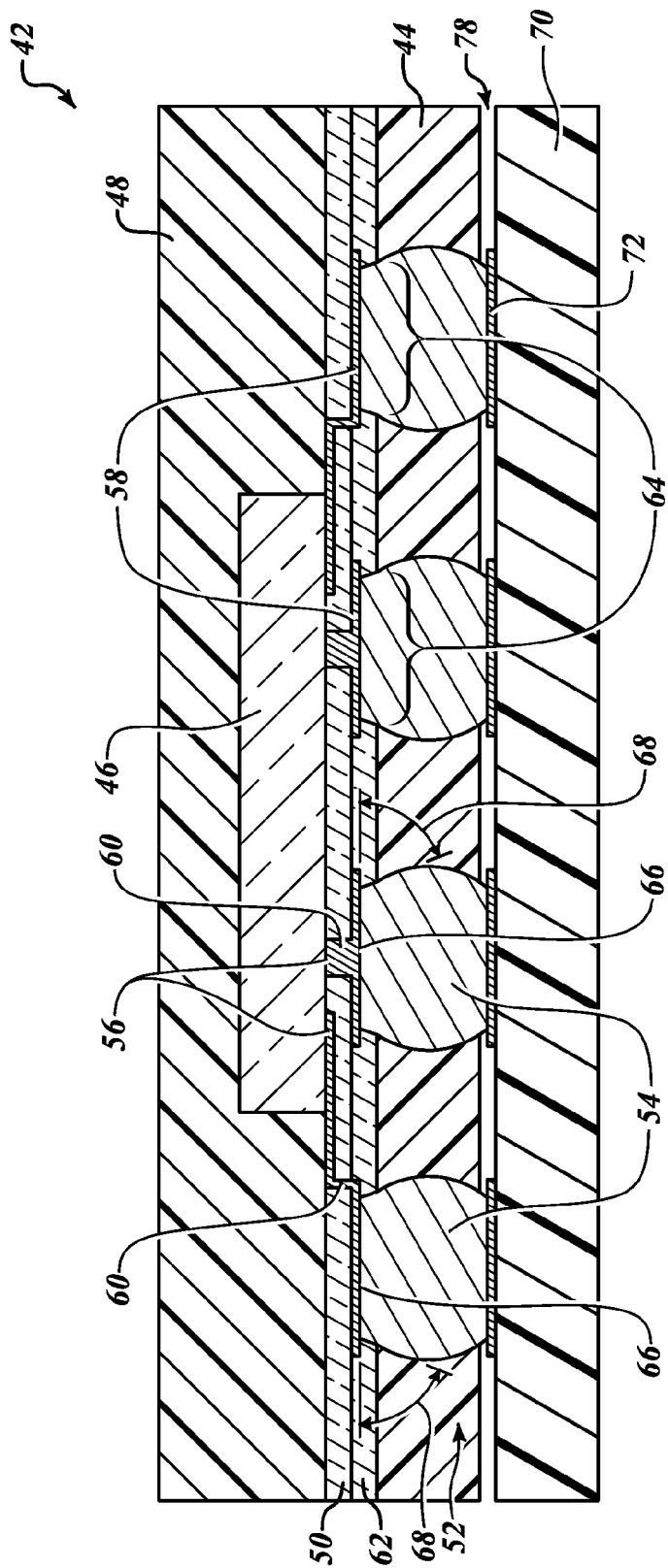
FIG. 7 illustrates a cross-sectional view of an electrical circuit having a polymeric layer in accordance with one embodiment of the present invention.

FIG. 7 illustrates an electronic package 42 having a polymeric layer 44 in accordance with principles of the present invention. For purposes of description, the polymeric layer 44 is described with reference to its application in a fan-out wafer-level electronic package. However, this in no way limits the use or application of the polymeric layer 44 to only fan-out wafer-level electronic packages. In fact, the polymeric layer 44 can be used or applied in other electronic packaging techniques including, for example, wafer-level chip scale packages, through-silicon via wafer-level packages, and electronic packaging techniques that use ball grid arrays (BGA) as an electrical interface.

In one embodiment, the package 42 includes the polymeric layer 44, a silicon die 46, an encapsulation material 48, a redistribution layer 50, and a solder ball array 52, including individual solder balls 54. The silicon die 46 includes electrical connection pads 56 on the die. The redistribution layer 50 is supported by a face of the die 46 having the connection pads 56 and by a surface of the encapsulation material 48 coplanar with the aforementioned die face.

The redistribution layer 50 includes fan-out pads 58 on a surface of the redistribution layer facing away from the die 46 and the encapsulation material 48. The redistribution layer 50 includes conductive traces 60 that electrically connect the fan-out pads 58 to the connection pads 56. The redistribution layer 50 supports a passivation layer 62 that covers the conductive traces 60, protecting them from exposure to solder during soldering operations. The passivation layer 62 includes windows 64 over the fan-out pads 58 that provide access to the fan-out pads 58. The redistribution layer 50 may be fabricated by any one of a number of fabrication techniques well known in the circuit packaging industry. In one embodiment, the redistribution layer 50 is made by screen printing each of several insulating and conducting layers that make up the redistribution layer 50, using the surface of the encapsulation material 48 and the previously described die 46 as a support.

Each solder ball 54 of the array 52 is placed on, and bonded to, a corresponding fan-out pad 58 through one of the access windows 64 in the passivation layer 62. At the interface between an individual solder ball 54 and a fan-out pad 58, a solder joint 66 is formed that bonds the solder ball 54 to the fan-out pad 58. At the solder joint 66, an acute angle 68 is formed between the surface of the approximately round solder ball 54 and the flat fan-out pad 58. As a result of the narrow angle, the stress experienced by the solder joint 66 from an applied stress becomes magnified at this location. The vulnerability of the solder joint 66 is countered by the polymeric layer 44.

In one embodiment, the polymeric layer 44 is a solidified form of a fluidic encapsulation material that substantially encompasses the solder balls 54 of the array 52. The polymeric layer 44 is a layer that in thickness extends from the passivation layer 62 to approximately a portion of each solder ball 54 most distant from the passivation layer. The polymeric layer 44 extends laterally along the ball grid array 52 to surround the sides of a plurality of the solder balls 54 of the ball grid array 52. In another embodiment, the polymeric layer 44 fills in a portion of the space in and around the balls of the solder ball array 52 closest to the passivation layer 62. In yet another embodiment, the polymeric layer 44 solidly fills all space in and around the balls 54 of the solder ball array 52, forming a web that encompasses the balls of the array. In a further embodiment, the polymeric layer 44 is tightly bound to the surfaces of the solder balls 54 of the array 52 and to the passivation layer 62.

In one embodiment, the polymeric layer 44 is a cured polymeric material well known as an encapsulation material in the electronic packaging industry. In another embodiment the encapsulation material is selected to avoid the presence of voids in the solidified polymeric layer 44. In a further embodiment the selected encapsulation material is viscous and void of air during dispensing, providing a void-free polymeric layer 44 upon solidification.

In yet a further embodiment, the material selected for the polymeric layer 44 is selected so that it is suitable for compression molding. In one embodiment the selected material is preheated before dispensing. A mold is used to control the thickness and lateral dimensions of the polymeric layer 44. The preheated material is dispensed into the mold and the polymeric layer 44 formed under heat or pressure, or both. In this embodiment the polymeric material 44 is substantially void-free and solidly fills space between the balls 54 of the ball grid array 52.

In the presence of an applied stress, the polymeric layer 44 provides improved mechanical and electrical reliability to the package 42 by accepting a portion of the applied stress that, without the polymeric layer 44, would be carried by the solder joint 66. In one embodiment, nearly all of the stress induced between the solder ball array 52 and the redistribution layer 50 of the package 42 is carried through the polymeric layer 44, and virtually no stress is carried by the solder joint 66. The applied stress may be applied by an externally applied mechanical force or by a thermal variation experienced by the package 42.

In one embodiment, the package 42 is attached to a printed circuit board 70 by attachment of the solder ball array 52 to PC board pads 72. A solder reflow process well known in the packaging industry is used to attach the package 42 to the printed circuit board pads 72.

Figure 8A:
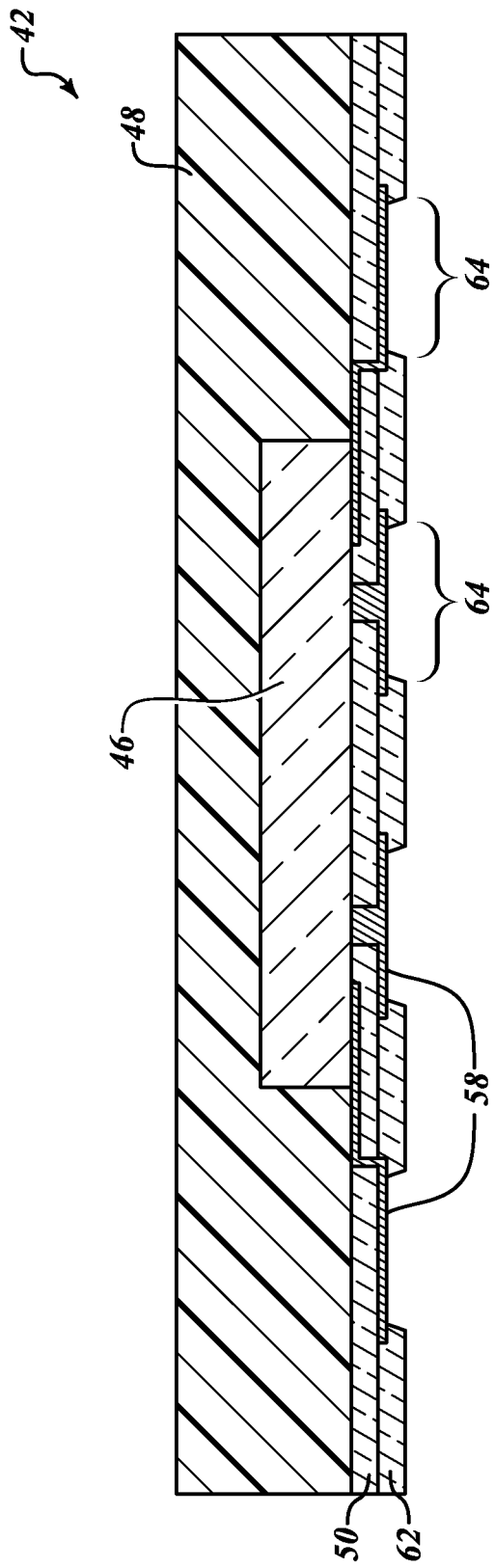

FIG. 8A illustrates a first step in a method of making the package 42 with the polymeric layer 44. In FIG. 8A, the passivation layer 62 is applied to the redistribution layer 50 forming the windows 64 over the fan-out pads 58. In one embodiment of the method, the passivation layer 62 is applied to the redistribution layer 50 using a screen printing process. Both the material used for the passivation layer 62 and the screen printing technique are commonly known in the packaging industry. However, other techniques for applying the passivation layer 62, or any technique for shielding the redistribution layer 50 during solder dispensing steps, is considered within the scope of the invention.

Figure 8B:
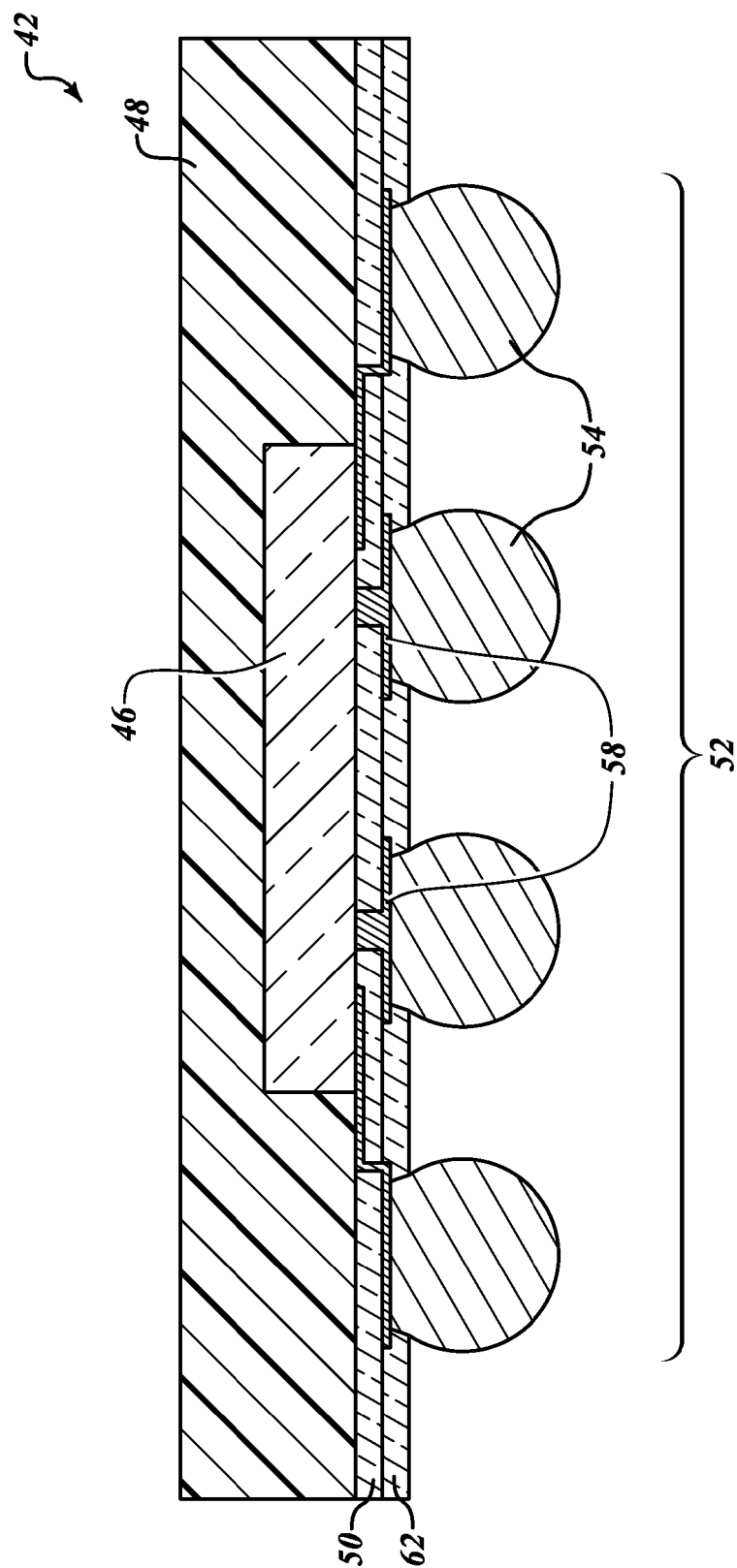

FIG. 8B illustrates a next step in a method of making the package 42 with the polymeric layer 44. In this step, the solder balls 54 of the ball grid array 52 are deposited on the fan-out pads 58 through the windows 64 of FIG. 8A using any one of a number of techniques well known in the industry. In one embodiment the solder balls 54 of the array 52 are dispensed from a needle.

Figure 8C:
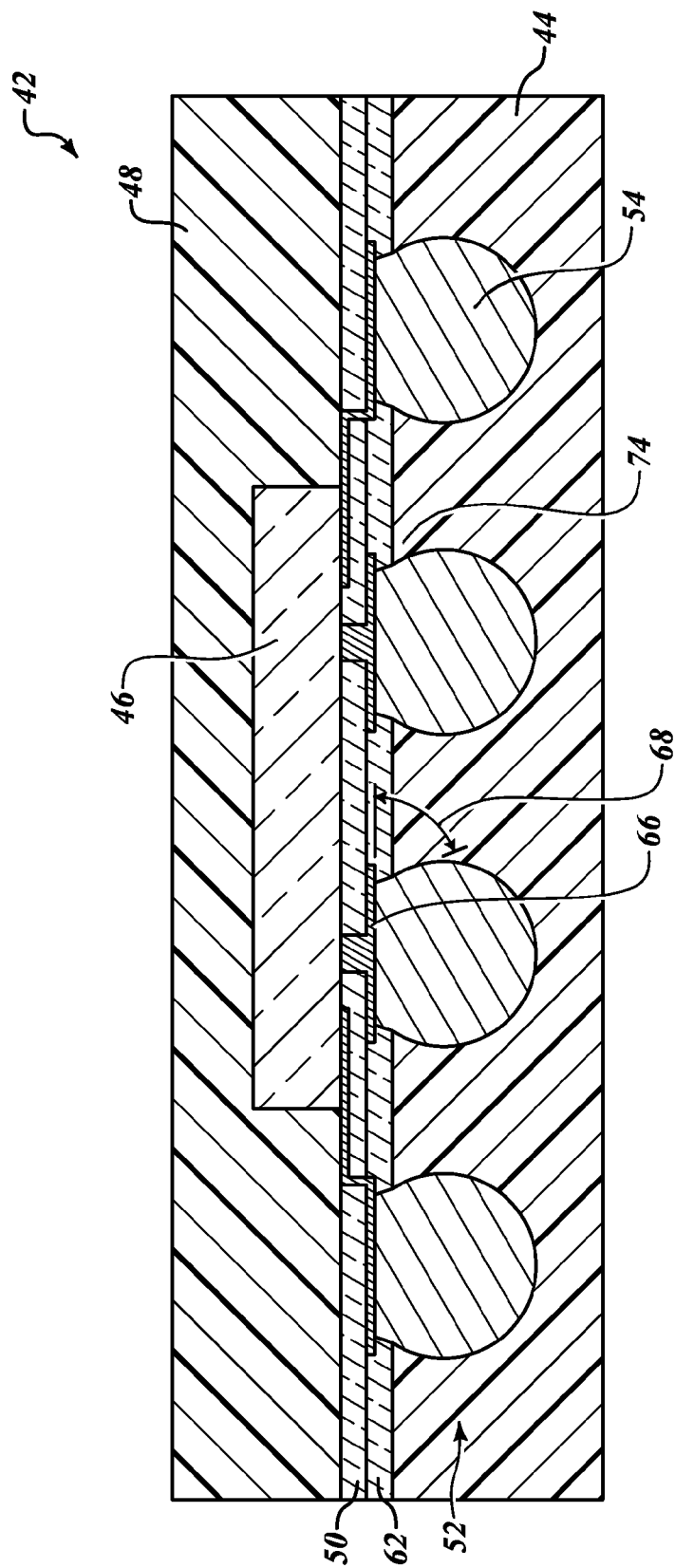

FIG. 8C illustrates a next step in a method of making the package 42 with the polymeric layer 44. In this step, the polymeric layer 44 is dispensed in fluid form over the solder balls 54 to a depth that submerges them. In one embodiment of the method, the material selected for the polymeric layer 44 is dispensed and formed over the array 52 by a compression molding technique. In yet a further embodiment, the material selected for the polymeric layer 44 is preheated before dispensing. A mold is used to control the thickness and lateral dimensions of the polymeric layer 44. The preheated material is dispensed into the mold and the polymeric layer 44 formed under heat or pressure, or both. In this embodiment the polymeric material 44 is substantially void-free and solidly fills space between the balls 54 of the ball grid array 52. Under the pressure of the compression molding technique, air or any other source of voids in the polymeric layer 44, especially at a critical region 74 in the vicinity of the solder joint 66, are removed.

Following dispensing of the fluidic material selected to form the polymeric layer 44, the fluidic material is solidified. Solidification of the dispensed material may be accomplished by curing, drying, aging, exposure to light or electromagnetic radiation, or any other method consistent with the particular material being used for the second encapsulation material 54. In one embodiment, the fluidic form of the polymeric layer 44 is a material cured by a chemical reaction between components of the selected material.

Figure 8D:
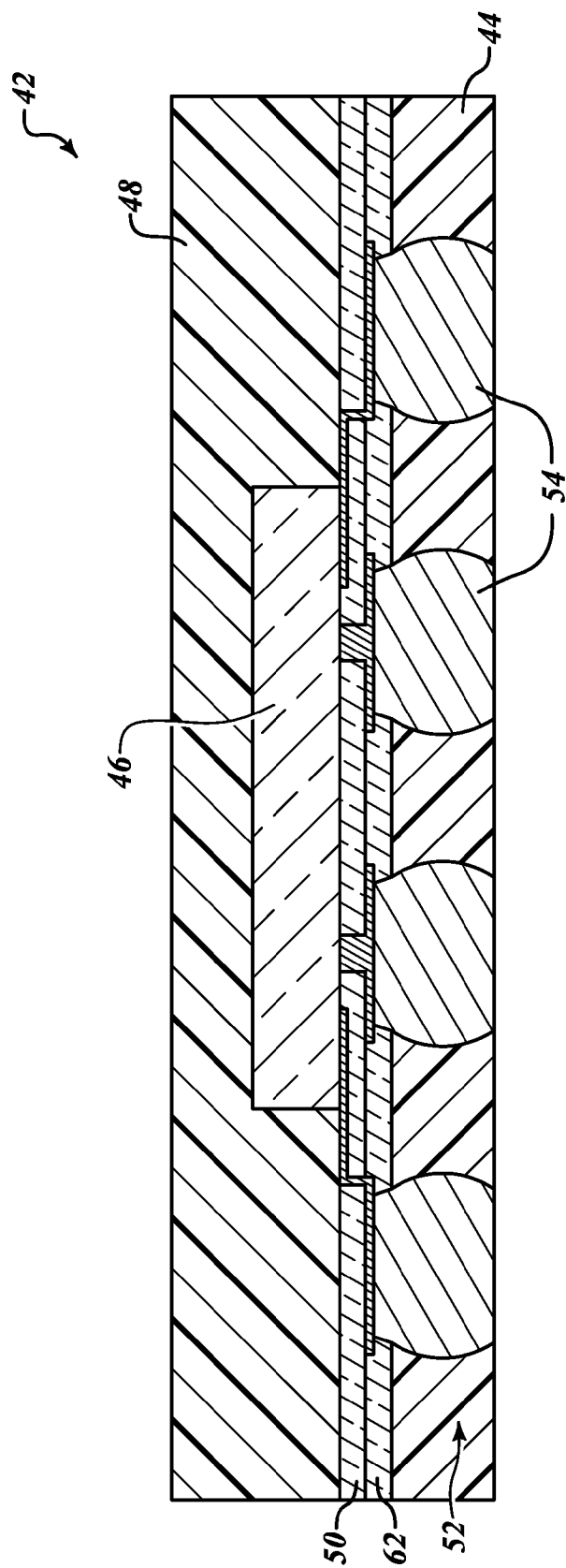

FIG. 8D illustrates a next step in a method of making the package 42 with the polymeric layer 44. In this step, a portion of the solidified polymeric layer 44 is removed to expose a surface of the solder ball grid array 52. In one embodiment of the method, the polymeric layer 44 is removed by grinding, causing a portion of each ball 54 of the ball grid array 52 to be removed along with a portion of the polymeric layer 44. This exposes balls 54 of the ball grid array 52 through the polymeric layer 44, providing access to the balls 54. In another embodiment of the method, the polymeric layer 44 is removed by a chemical process in which a portion of the polymeric layer 44 is chemically eroded, with only a minor portion of the balls 54 being removed. As a result, the balls 54 of the ball grid array 52 extend above the polymeric layer 44. This second embodiment provides greater access to the balls 54 of the ball grid array 52 without diminishing the additional strength brought about by the polymeric layer 44. In a third embodiment of the method, the polymeric layer 44 is removed a chemical mechanical process in which a mechanical polishing in combination with an applied chemical polishing compound removes a portion of both the polymeric layer 44 and the solder balls 54 of the ball grid array 52. Although both are removed, by this process the material of the polymeric layer 44 is more easily removed than the metallic solder balls 54, resulting in the solder balls 54 extending above the surface of the polymeric layer 44

FIG. 8E illustrates a next step in a method of making the package 42 with the polymeric layer 44. In this step, the package 42 is bonded to the PC board 70 using a solder reflow process. Solder paste deposits 76 are applied to the printed circuit board pads 72 on a side of the PC board 70. The package 42 with the polymeric layer 44 is placed on the PC board 70 so that the balls 54 of the ball grid array 52 line up with the PC board pads 72. The solder paste deposits 76 on the PC board pads 72 are then reflowed by heating using a process conventional in the industry. The reflowed solder paste deposits 76 electrically connect the solder balls 54 of the ball grid array 52 to the corresponding PC board pads 72, connecting the package 42 to the PC board 70. The package 42 and the PC board 70 are separated by a gap or separation region 78, shown in FIG. 7.

In a final step, in the event that the method is being performed on an array of individual packages, the individual packages are singulated. In one embodiment, the packages are singulated from the array using a wafer saw, as is conventional in the industry.

The polymeric layer 44 provides enhanced board-level reliability due to the reinforcement provided by the polymeric layer 44 that encompasses each solder joint 66. Mechanical drop tests and thermal cycling tests show improved mechanical and electrical reliability due to the relief provided to the solder joint 66 by the polymeric layer 44. Due to the fact that most failures of the solder joint 66 in fan-out wafer-level packages occur on the component side (the solder ball 54 and fan-out pad 58 interface), the polymeric layer 44 is a particularly advantageous technique for preventing these failures. Three particular failure modes it reduces or prevents are passivation layer delamination, silicon die crack, and solder bond joint failures, described above in the prior art.

The polymeric layer technique has several advantages over competing prior art techniques for strengthening solder bond joints 66. An advantage that the polymeric layer technique has over the polymer flux process is that in the polymeric layer technique the thickness of the polymeric layer 44 is more precisely controlled. The precision comes from the grinding step that determines the thickness of the polymeric layer 44. With the polymer flux technique, the thickness of the polymer is controlled during deposition, which is less controllable than grinding. Compared with the polymer flux process, the polymeric layer technique also more completely encompasses the solder joints 66, offering greater protection and stress buffering.

An advantage of the polymeric layer technique over the front side protect technique is that with the polymeric layer technique there is no possibility for a void to occur in the polymeric layer 44, especially at the solder joint 66. This is the case because the polymeric layer 44 is compression molded around the balls 54 of the grid array 52, eliminating air. With the front side protect technique, the protection material is not applied under pressure, and therefore voids in the protection material are more likely to occur. Compared with the front side protect technique, the polymeric layer technique also more completely encompasses the solder joints 66, offering greater protection and stress buffering.

An advantage of the polymeric layer technique over the underfill technique is that with the polymeric layer technique rework is much easier. This is the case because with the polymeric layer technique, the polymeric layer 44 is stays with the package 42 upon removal of the package 42 from the PC board 70. With the underfill technique, underfill is left behind on both the package 42 and the PC board 70. The underfill must be removed from both of these before the package 72 could be remounted to the PC board 70. With the polymeric layer technique the PC board 70 is absent any polymeric material after removal of the package 72.

Another advantage of the polymeric layer technique over other techniques for reinforcing the solder joint 66 is that the technique can be implemented before singulation. The benefit this provides is that electrical functional testing after the reinforcement technique is implemented can still be conducted at the wafer level. Compared with techniques that require singulation before they may be implemented (for example the underfill technique), functional testing following reinforcement must be conducted on singulated packages, instead of at the wafer level.

Yet another advantage related to the polymeric layer technique for solder joint reinforcement specific to fan-out wafer-level packages is that the technique does not interrupt any of the current processing steps used to make a fan-out wafer-level package. The technique is achieved by simply adding two additional process steps, the compression molding step and the grinding step, after the fan-out wafer-level package has already been built.

The term reconfigured wafer refers to a wafer that comprises a plurality of semiconductor dice embedded in a layer of encapsulation material with active faces of the dice lying in a same plane with a face of the layer of encapsulation material. Reconfigured die refers to the portion of a reconfigured wafer that forms part of a single semiconductor package after singulation of the wafer, and includes a semiconductor die embedded in a layer of encapsulation material with an active face of the die lying in a same plane with a face of the layer of encapsulation material.

The following U.S. patent applications, filed concurrently herewith, are directed to subject matter that is related to or has some technical overlap with the subject matter of the present disclosure: MULTI-STACKED SEMICONDUCTOR DICE SCALE PACKAGE STRUCTURE AND METHOD OF MANUFACTURING SAME, by Kim-Yong Goh, Ser. No. 12/651,080; FAN-OUT WAFER LEVEL PACKAGE FOR AN OPTICAL SENSOR AND METHOD OF MANUFACTURE THEREOF, by Kim-Yong Goh and Jing-En Luan, Ser. No. 12/651,304; FLIP-CHIP FAN-OUT WAFER LEVEL PACKAGE FOR PACKAGE-ON-PACKAGE APPLICATIONS, AND METHOD OF MANUFACTURE, by Kim-Yong Goh and Jing-En Luan, Ser. No. 12/651,365; and RELIABLE LARGE FAN-OUT WAFER LEVEL PACKAGE AND METHOD OF MANUFACTURE, by Kim-Yong Goh and Jing-En Luan, Ser. No. 12/651,362; each of which is incorporated herein by reference in its entirety.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary, to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus comprising:
   a reconfigured die, including a semiconductor die embedded in a layer of encapsulation material with an active face of the semiconductor die lying in a same plane with a face of the layer of encapsulation material;
   a fan-out redistribution layer positioned on a face of the reconfigured die and including electrically conductive traces that provide electrical connection between contact pads of the semiconductor die and fan-out pads positioned outside a perimeter of the semiconductor die;
   solder elements bonded to the fan-out pads, each solder element being of a single, continuous component; and
   a rigid polymeric layer overlying the fan-out redistribution layer, the polymeric layer partially encompassing the solder elements, wherein a portion of each of the solder elements extends beyond a surface of the rigid polymeric layer.

2. The apparatus of claim 1 wherein the solder elements have a flat surface on a side of the solder elements furthest from the reconfigured die.

3. The apparatus of claim 1 wherein the rigid polymeric layer is a solidified encapsulation material.

4. The apparatus of claim 3 wherein the solidified encapsulation material solidly fills regions adjacent to joints between the solder elements and the fan-out pads, the region at each joint bounded by an acutely-angled intersection of the fan-out pad with the solder element.

5. The apparatus of claim 1, further comprising a passivation layer covering the electrically conductive traces of the fan-out redistribution layer.

6. The apparatus of claim 5, wherein the rigid polymeric layer is positioned on a surface of the passivation layer.

7. A method for making an electrical circuit, comprising:
forming a reconfigured wafer, including embedding a semiconductor die in a layer of encapsulation material with an active face of the die lying in a same plane with a face of the layer of encapsulation material;
forming a fan-out redistribution layer on a face of the reconfigured wafer, including forming electrical traces in electrical contact with respective contact pads of the semiconductor die, and forming fan-out pads positioned outside a perimeter of the semiconductor die and in electrical contact with respective ones of the electrical traces;
placing solder elements on the redistribution layer and in electrical contact with respective ones of the fan-out pads;
dispensing a fluidic polymeric material on at least a portion of the fan-out distribution layer and around the solder elements;
solidifying the dispensed fluidic polymeric material to a more rigid state;
exposing a portion of each solder element to extend beyond a surface of the solidified polymeric material by removing a portion of the solidified polymeric material.

8. The method of claim 7 wherein solidifying the dispensed fluidic polymeric material includes at least one of curing, drying, evaporating, aging, and exposing to electromagnetic radiation.

9. The method of claim 7 wherein removing the portion of the solidified polymeric material includes at least one of chemically eroding and chemically-mechanically polishing.

10. The method of claim 7 wherein solidifying the dispensed fluidic polymeric material comprises subjecting the fluidic polymeric material to heat and pressure.

11. The method of claim 7 wherein the semiconductor die is one of a plurality of semiconductor dice, and forming a reconfigured wafer includes embedding the plurality of semiconductor dice in the layer of encapsulation material with active faces of each of the dice lying in the same plane with the face of the layer of encapsulation material.

12. The method of claim 11, comprising, after removing the portion of the solidified polymeric material, cutting the reconfigured wafer and elements positioned thereon into individual semiconductor packages, each including at least one of the plurality of semiconductor dice.

\* \* \* \* \*